(12) United States Patent
Fournel

(10) Patent No.: US 6,232,830 B1
(45) Date of Patent: May 15, 2001

(54) CIRCUIT FOR THE REGULATION OF AN OUTPUT VOLTAGE OF A CHARGE PUMP DEVICE

(75) Inventor: Richard Fournel, Lumbin (FR)

(73) Assignee: STMicroelectronics S.A., Gentilly (FR)

( * ) Notice: Subject to any disclaimer, the term of this patent is extended or adjusted under 35 U.S.C. 154(b) by 0 days.

(21) Appl. No.: 09/409,007

(22) Filed: Sep. 29, 1999

(30) Foreign Application Priority Data

Sep. 30, 1998 (FR) ................................................ 98 12200

(51) Int. Cl.[7] .................................................... G05F 1/10
(52) U.S. Cl. ............................................. 327/540; 327/544
(58) Field of Search ................................... 327/536, 538, 327/540, 544, 589

(56) References Cited

U.S. PATENT DOCUMENTS

| 5,461,338 | 10/1995 | Hirayama et al. | 327/534 |
| 5,557,231 | 9/1996 | Yamaguchi et al. | 327/534 |
| 5,703,522 | 12/1997 | Arimoto et al. | 327/534 |
| 5,900,665 | 5/1999 | Tobita | 257/357 |
| 6,091,282 | * 7/2000 | Kim | 327/536 |
| 6,107,862 | * 8/2000 | Makainakano et al. | 327/536 |

FOREIGN PATENT DOCUMENTS

| 0039946A2 | 11/1981 | (EP) | H03K/19/094 |
| 0800212A2 | 10/1997 | (EP) | H01L/27/04 |
| 2319370A | 5/1998 | (GB) | G11C/11/407 |
| 98/59419 | 12/1998 | (WO) | H03K/3/01 |

* cited by examiner

Primary Examiner—Jung Ho Kim
(74) Attorney, Agent, or Firm—Theodore E. Galanthay; Allen, Dyer, Doppelt, Milbrath & Gilchrist, P.A.

(57) ABSTRACT

A regulation circuit for regulating an output voltage of a positive charge pump for an integrated circuit includes a comparison circuit receiving a reference voltage at an input, and delivering an enabling signal at an output to the positive charge pump. The regulation circuit further includes a first switching circuit controlled by a first control signal for the application of a first voltage level as a reference voltage when the integrated circuit is in an operational mode, and the application of a second voltage level as the reference voltage when the integrated circuit is in a standby mode.

27 Claims, 6 Drawing Sheets

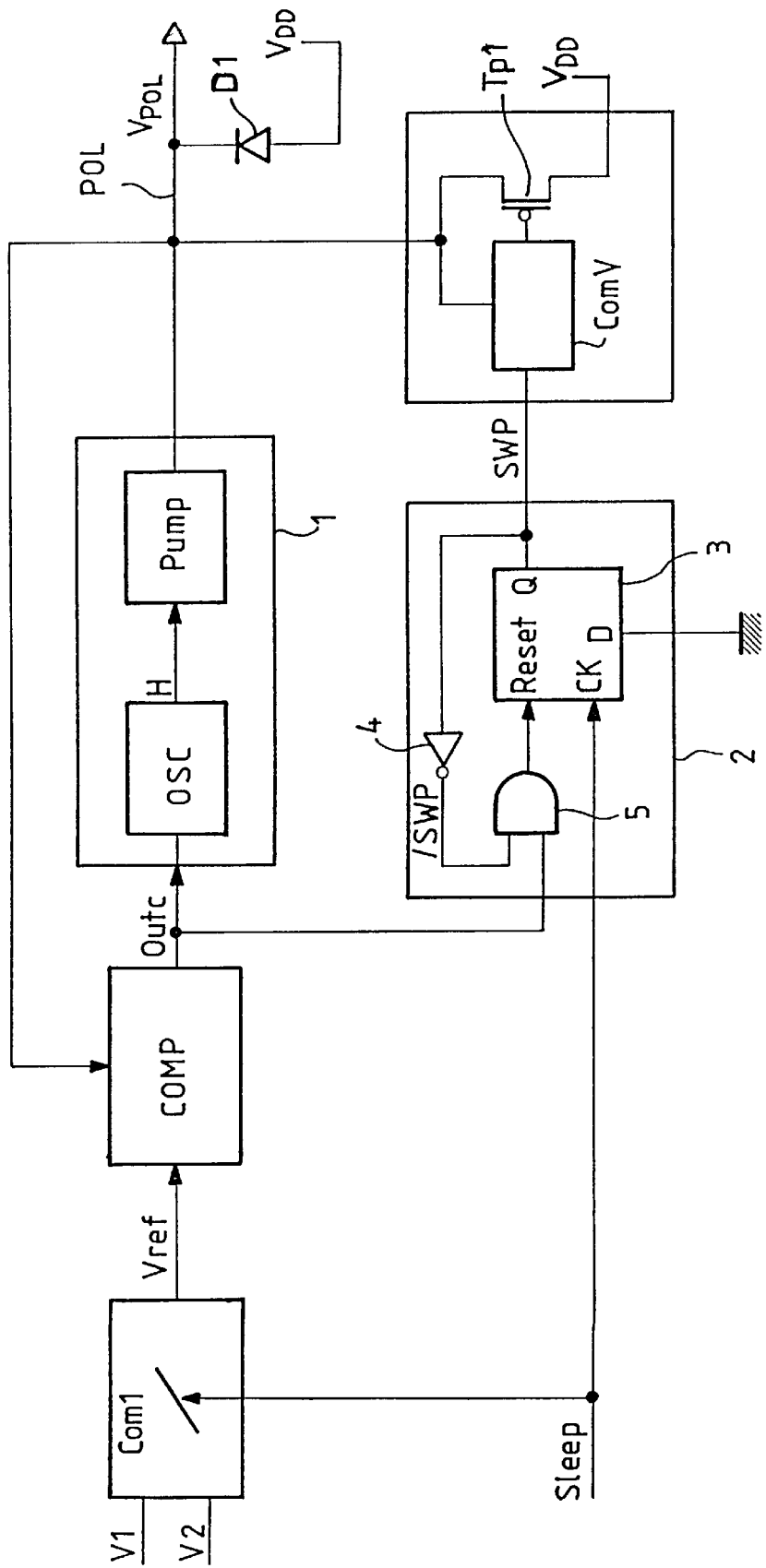
FIG_1

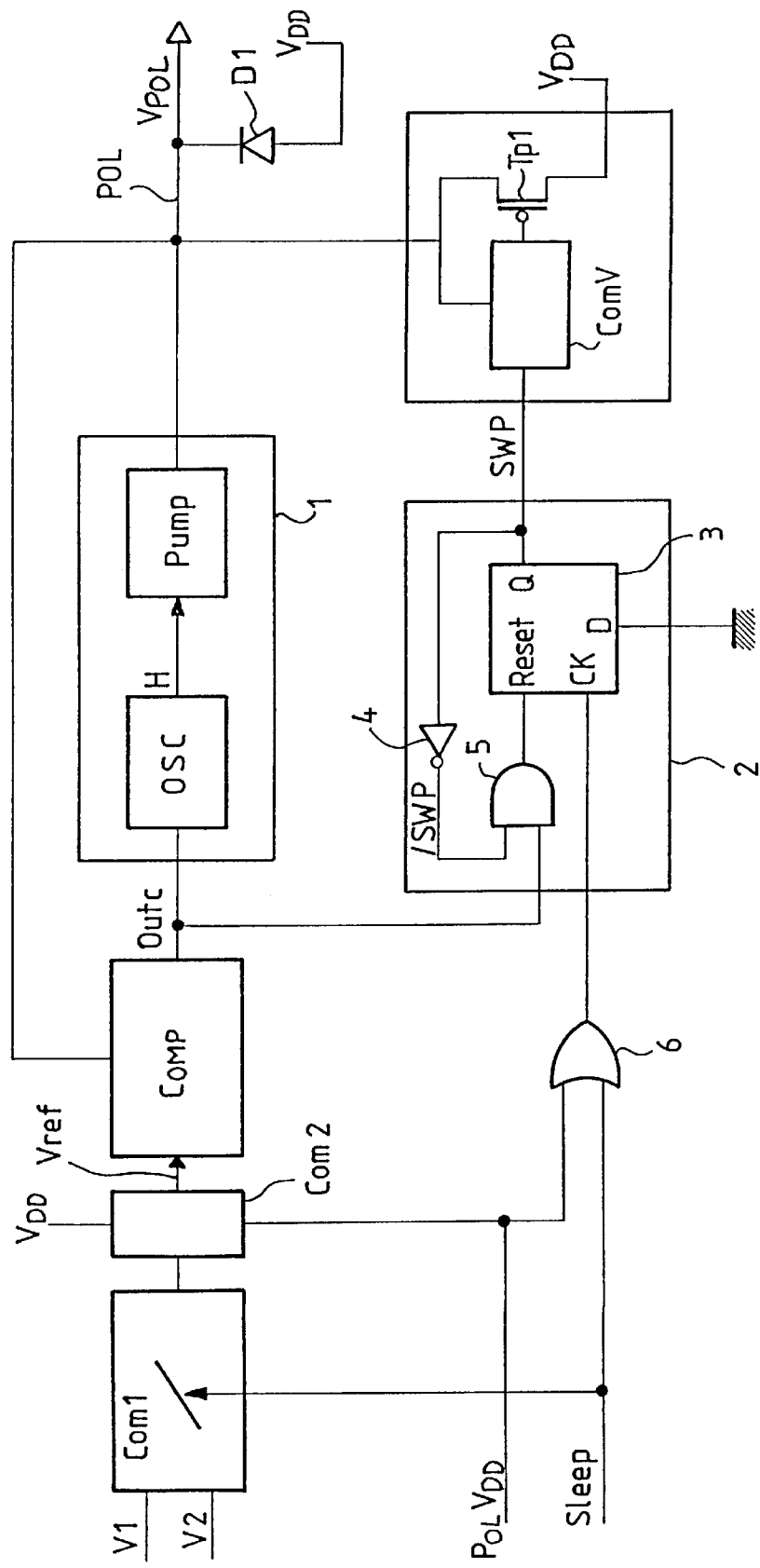
FIG_1a

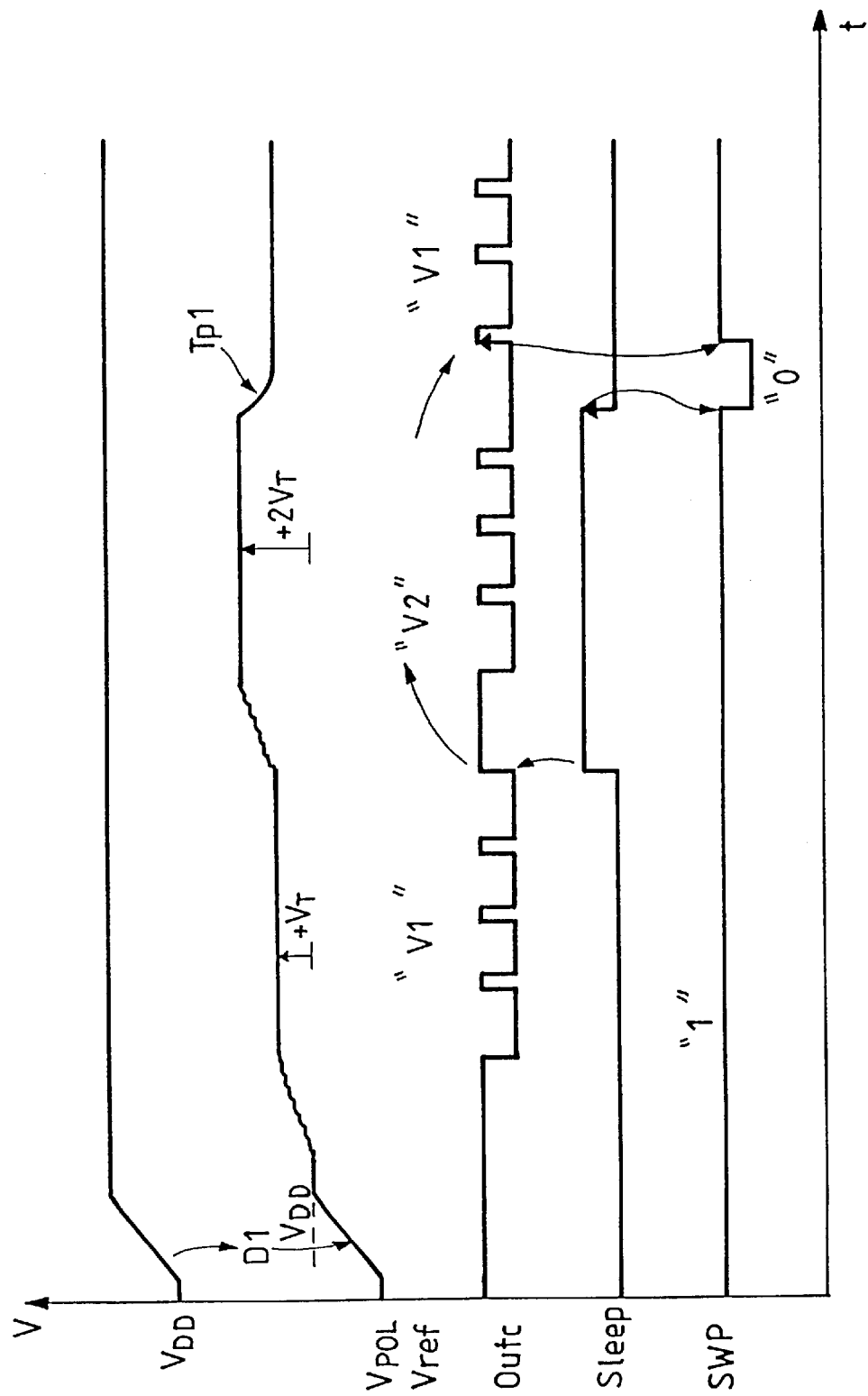
FIG_2

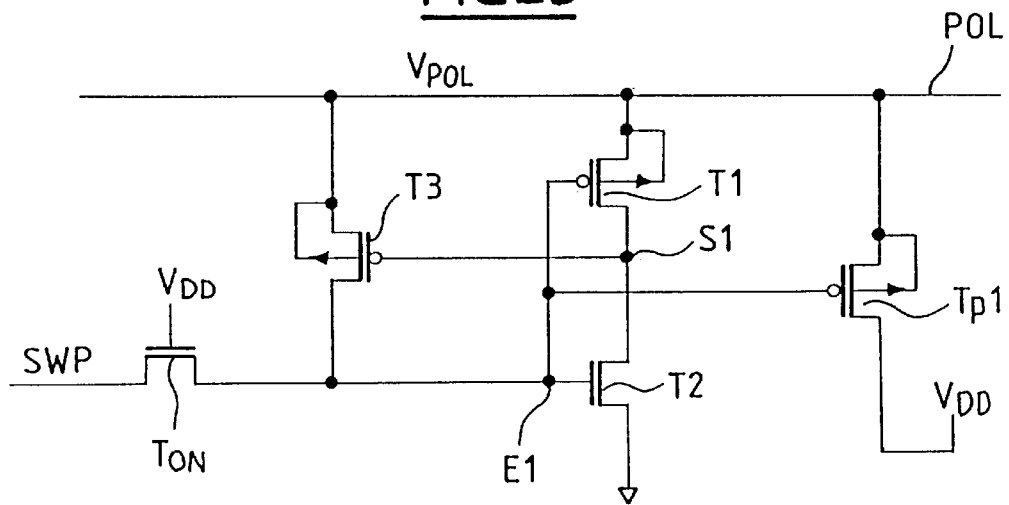
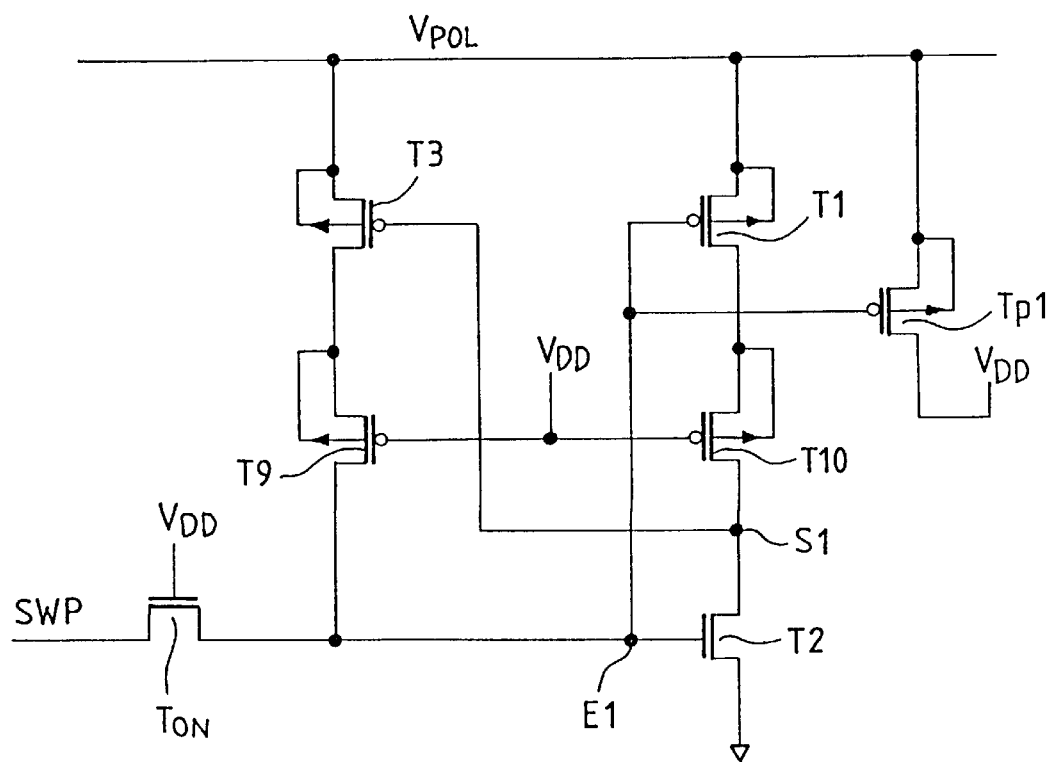

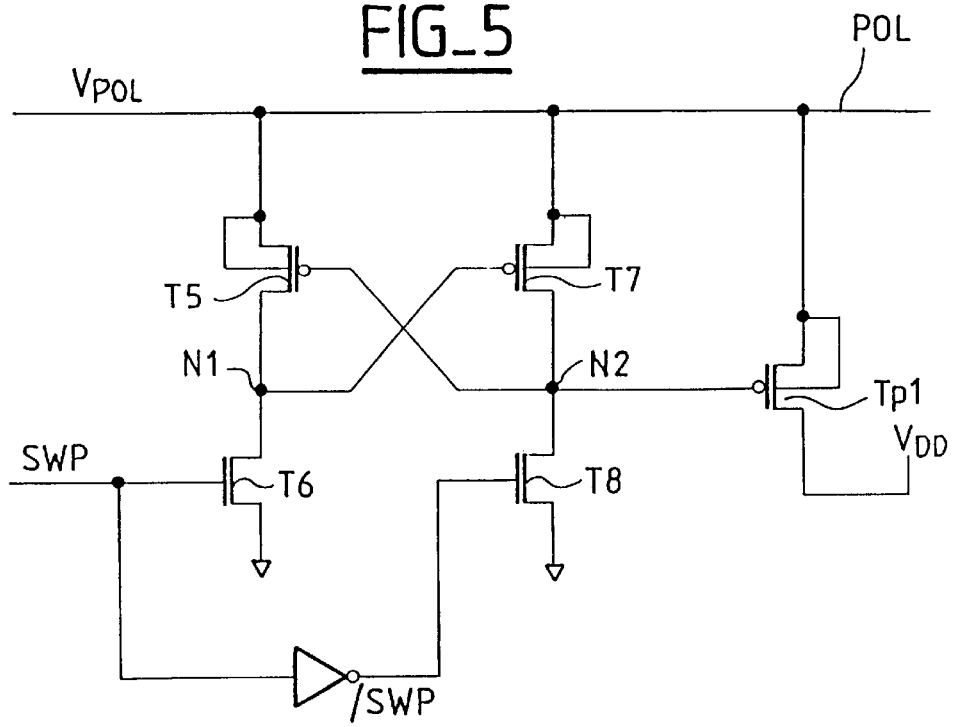
FIG_5
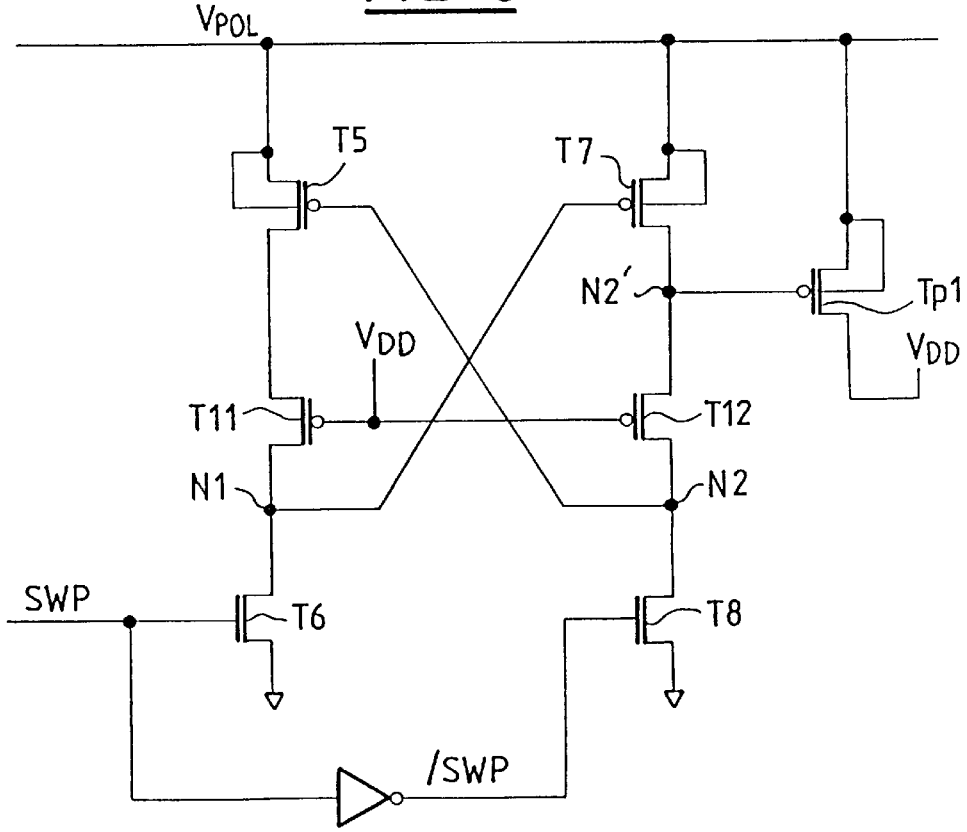
FIG_6

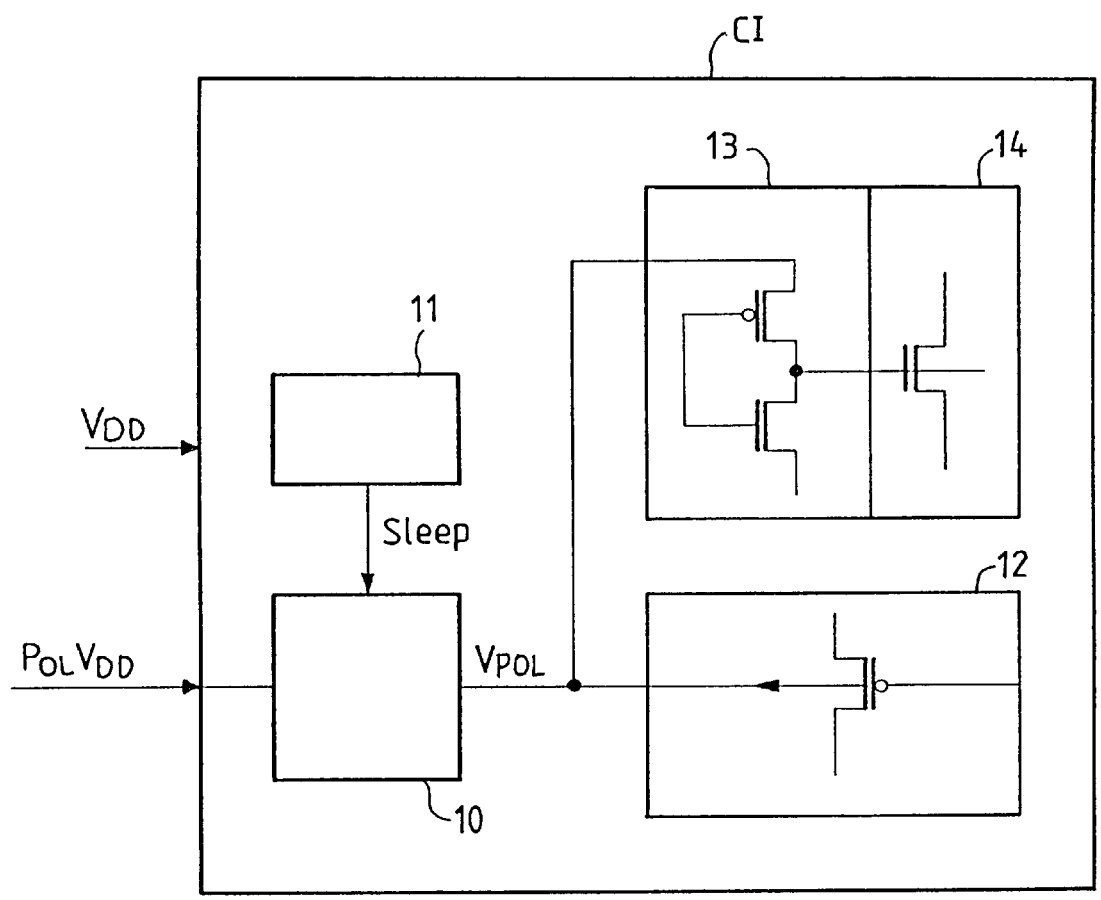
FIG_7

CIRCUIT FOR THE REGULATION OF AN OUTPUT VOLTAGE OF A CHARGE PUMP DEVICE

FIELD OF THE INVENTION

The present invention relates to the field of electronics, and, more particularly, to a regulation circuit for a charge pump.

BACKGROUND OF THE INVENTION

A circuit for the regulation of an output voltage of a positive charge pump device can be applied particularly to integrated circuits using MOS or CMOS technology operating at low power supply voltages. In particular, the circuit can be applied to integrated circuits using 0.25 micron technology adapted to operate at a supply voltage of 2.5 volts (±10%). Also, the circuit may be required to operate at lower voltages closer to 1 volt in certain applications intended for low power consumption, such as DRAM circuits.

For these applications, the leakage current of P-channel MOS transistors is reduced. In DRAMs, it is useful, for example, to reduce the leakage current of the memory cells to increase their retention time. It is also useful to reduce the power consumption of the integrated circuits in standby mode, particularly for portable or on-board installed systems.

SUMMARY OF THE INVENTION

According to the invention, a regulation device regulates the output voltage of a positive charge pump generator which supplies an output voltage greater than the supply voltage $V_{DD}$ of the integrated circuit. This voltage is applied as the bias voltage for the wells of the P-channel MOS transistors of the integrated circuit. A reinforcement is thus obtained for the blocking of the P-channel transistors, which makes it possible to limit or eliminate the current leakages due to these transistors.

Preferably, to obtain better results in terms of limiting leakage currents in an operational mode and in a standby mode, the regulation device according to the invention controls the output voltage of the positive charge pump as a function of the control signals. In the operational mode of the integrated circuit, the output regulated voltage is greater by one MOS transistor threshold voltage level than the power supply voltage of the circuit. In other words, the output voltage is equal to $V_{DD}+V_T$. In the standby mode of the integrated circuit, the output regulated voltage is greater by about two MOS transistor threshold voltage levels than the supply voltage of the circuit, i.e., the output voltage is equal to $V_{DD}+2*V_T$.

According to the invention, the regulation device comprises means for the transition, at output, from one regulated voltage level to the other as swiftly as possible. It is also possible to impose the level $V_{DD}$ of the supply voltage as an output voltage level using an external command. At a low or a very low supply voltage $V_{DD}$, and with an output voltage equal to $V_{DD}+V_T$ applied as a bias voltage for the wells of the P-channel MOS transistors in the operational mode, it is possible that the level $V_{DD}+V_T$ will not allow the execution speed in the integrated circuit to be maintained. The functions of the integrated circuit then will no longer be guaranteed. The external command according to the invention dictates the normal level $V_{DD}$ of the supply voltage as the bias voltage of wells, thus enabling the circuit to work normally while consuming more current because of the deterioration of the current specification.

The invention therefore relates to a circuit for the regulation of an output voltage of a positive charge pump voltage generation device of an integrated circuit. The regulation device comprises a comparison circuit receiving a reference voltage at an input, and delivers an enabling signal at an output to the positive charge pump device. The circuit furthermore comprises a first switching circuit controlled by a first control signal for the application of a first voltage level as a reference voltage when the integrated circuit is in the operational mode, and the application of a second voltage level as the reference voltage when the integrated circuit is in the standby mode.

BRIEF DESCRIPTION OF THE DRAWINGS

Other features and advantages of the invention are described in detail in the following description given by way of an example that in no way restricts the scope of the invention, made with reference to the appended drawings, of which:

FIGS. 1 and 1a respectively show a block diagram of a regulation circuit according to the present invention.

FIG. 2 is a timing diagram of signals implemented in the circuit of FIG. 1.

FIGS. 3 and 4 respectively show a detailed exemplary embodiment of a switching circuit used in the regulation circuit according to the present invention.

FIGS. 5 and 6 respectively show an alternative detailed exemplary embodiment of the switching circuit used in the regulation circuit according to the present invention.

FIG. 7 shows an exemplary application of the regulation circuit in an integrated circuit according to the present invention.

DETAILED DESCRIPTION OF THE PREFERRED EMBODIMENTS

FIG. 1 shows a circuit for the regulation of an output voltage $V_{POL}$ of a voltage generation device 1. This voltage generation device 1 has an oscillator OSC associated with a positive charge pump Pump to give an output voltage $V_{POL}$ higher than the supply voltage $V_{DD}$ of the integrated circuit. Circuit elements such as these are well known to those skilled in the art. The regulation circuit has a comparator COMP to compare the output voltage $V_{POL}$ with a reference voltage Vref. This comparator gives an enabling signal Outc at an output which is applied to the oscillator OSC of the voltage generation device 1.

According to the invention, the regulation circuit comprises a first switching circuit Com1 for the application as a reference voltage of a first voltage level V1 in an operational mode, and a second voltage level V2 in a standby mode. This switching circuit is controlled by a first control signal Sleep, which is the standby setting signal for the integrated circuit. This standby setting signal is generated internally by a control circuit of the integrated circuit in response to the voltage generation device 1.

As shown in FIG. 2, when this standby setting signal is inactive (Sleep at a logic 0), the voltage level applied as a reference voltage is the first level V1. Inactive means that the integrated circuit is in an operational mode, i.e., the integrated circuit is executing instructions. The output voltage $V_{POL}$ at the output of the voltage generation device 1 is taken to this level V1 and kept there by the regulation circuit. In standby mode (Sleep at a logic 1), it is the second level V2 that is applied as the reference voltage. The output voltage VPOL at output of the voltage generation device 1 is taken to this level V2 and kept there.

In an application of the output voltage VPOL as a bias voltage for the wells of the P-channel MOS transistors, the first level V1 is set equal to VDD+VT. VT is the threshold voltage of a transistor. Hereinafter, all the transistors referred to are MOS transistors. The second level V2 is equal to VDD+2*VT. Operationally, the leakage currents in the P-channel transistors are limited while, at the same time, the transistors work at a sufficient speed. The functions of the integrated circuit are thus ensured. In a standby mode, the blocking of these transistors is reinforced to further limit or even eliminate the leakage currents.

According to the invention, to further decrease the level of the output voltage VPOL from V2, and to carry out this switching as fast as possible with the smallest possible level of energy losses, the regulation circuit further comprises a second switching circuit ComV and a discharge transistor Tp1. The second switching circuit ComV is connected between the output voltage VPOL and ground. It is controlled by the first control signal Sleep through a logic circuit 2 to further decrease the level of the output voltage VPOL.

This switching circuit provides for a fast transition from one output level to the other. In the exemplary application of the regulation circuit for biasing the wells of P-channel transistors, the second level V2 in the standby mode is higher than the first level V1 in the operational mode. In this exemplary application, it is useful to bring about a fast reduction in the output voltage from the upper level V2 to below the level V1 to reactivate the oscillator and the charge pump. The first level V1 is obtained very rapidly at output VPOL with the lowest possible energy losses.

FIG. 2 is a timing diagram of signals implemented in the circuit of FIG. 1. The comparison signal Outc at the output of the comparator activates the oscillator whenever the output voltage is below the level of the reference voltage Vref to be obtained. This signal Outc goes from a logic 0 to a logic 1 if the voltage VPOL goes below the reference voltage. The level 1 activates the oscillator and, therefore, the positive charge pump. As soon as this voltage goes back to a level above the reference voltage, the signal Outc goes from a logic 1 to a logic 0. It remains at a logic 0 as long as the last inequality remains verified.

Referring to FIG. 2, if the reference voltage Vref is at the level V1 corresponding to the operational mode (Sleep=0), the signal Outc regularly reactivates the oscillator to maintain the condition VPOL>Vref. If there is a transition into the standby mode, the reference voltage goes to the level V2 which is higher than the level V1. The signal Outc will reactivate the oscillator until a voltage VPOL, higher than the level V2, is maintained at the output. If thereafter there is a return to the operational mode, it is necessary to go back to a lower voltage (V1). Without the discharge transistor Tp1, this would take a great deal of time. The discharge transistor Tp1 provides for a fast discharging of the output line (VPOL) to a level below the level V1 to be reached. The oscillator and the charge pump are then reactivated regularly by the signal Outc, as discussed above.

To obtain this operation, the logic circuit 2 comprises a D-type flip-flop circuit referenced 3 in FIG. 1. The D input is grounded, and the clock input CK receives the first control signal Sleep. At the Q output, it gives a second control signal SWP. An inverter 4 causes the reverse signal /SWP of this second control signal to be applied to an input of an AND gate 5. The AND gate 5 also receives the comparison signal Outc at a another input. This logic circuit 2 is used to form the second control signal SWP from the signals Outc and Sleep. The second control signal SWP provides a low transition from a logic 1 to a logic 0 on the trailing edge of the first control signal, and provides a high transition on the next transition from a logic 0 to a logic 1 of the comparison signal Outc.

The operation obtained is as follows. When the operational mode becomes active again, the signal SWP controls the discharge of the output line POL. The conditions for the operational mode are that the SWP signal trails the transition of the signal Sleep, and V1 is applied as a reference voltage Vref. When the output voltage VPOL reaches a level lower than the first voltage level V1, which is represented by the transition from a logic 0 to a logic 1 of the comparison signal Outc, the signal SWP is deactivated. This stops the discharge.

The discharge transistor Tp1 in the example is a P-channel transistor. It is connected between the output voltage VPOL and a voltage level below the first voltage level V1. In the example and as a matter of preference, it is connected between the output voltage VPOL and the power supply voltage VDD of the integrated circuit. Having the discharge only at VDD results in optimizing the speed of transition from one level to another and minimizes the energy losses.

In a preferred embodiment, the regulation circuit further comprises a diode D1 having its cathode connected to the output voltage VPOL, and its anode connected to the supply voltage VDD of the integrated circuit. As shown in FIG. 2, this makes it possible at the time of powering on when the diode is forward-biased to make the output line VPOL rise quickly to the level of the supply voltage.

In one alternative embodiment of the invention, the regulation circuit further comprises means to set the output voltage VPOL at the level of the supply voltage VDD upon the activation of an external control signal POLVDD. In an exemplary embodiment shown in FIG. 1a, these means include a switching circuit Com2 that imposes the supply voltage VDD as a reference voltage Vref. These means furthermore include a logic gate 6, which is an OR type logic gate in the example, receiving the external control signal POLVDD and the first control signal Sleep at an input. The output of this gate is applied to the clock input CK of the flip-flop circuit 3 of the logic circuit 2.

These additional means make it possible by activation (logic 0) of the external control signal POLVDD to set the output voltage VPOL at the level of the supply voltage VDD. If, in the operational mode, the integrated voltage is excessively slowed down by the voltage level V1 when applied as a well bias voltage, these additional means Com2, 6 set the well bias voltage at the level of the voltage commonly used (VDD). In this case, the benefit of the reduction of the current consumption is lost, but the function of the integrated circuit is recovered. These additional means according to the invention therefore act as a failsafe measure that can be activated by an external command enabling the function of the integrated circuit to be maintained.

The activation of the external control signal POLVDD leads to a decrease in the level of the output voltage VPOL which, at this time, may be at V1 as well as at V2. This decrease occurs towards the level of the power supply voltage VDD as described above, and is obtained by the logic circuit 2, the voltage switching circuit ComV, and the discharge transistor Tp1 resulting in the least possible energy losses.

FIG. 3 shows a voltage switching circuit ComV in a first exemplary low impedance embodiment to control the discharge transistor Tp1. In this example, the second control signal SWP is applied to a drain of a transistor T$_{ON}$ that is always on. In the example, it is an N-channel transistor whose gate is biased at V$_{DD}$. The switching circuit includes a first P-channel transistor T1 and a second N-channel transistor T2 forming an inverter connected between the supply voltage V$_{POL}$ and ground. The input E1 of this inverter is applied as a gate command of the discharge transistor Tp1. The output S1 of this inverter is applied as a gate command to a third P-channel holding transistor T3 connected between the output voltage V$_{POL}$ and the input E1 of this inverter. Input E1 receives the second control signal SWP through the transistor T$_{ON}$.

When the second control signal SWP is activated (SWP at a logic 0), the discharge transistor Tp1 comes on and causes a decrease in the level of the output voltage V$_{DD}$. When the second control signal SWP is deactivated (SWP at a logic 1), the holding transistor T3 is on. This makes it possible for the level 1 to be held at the input of the inverter. In the improvement shown in FIG. 4, there are provided two additional P-channel transistors controlled at their gates by the supply voltage V$_{DD}$ to limit the output voltage V$_{POL}$. A first transistor T9 is between the holding transistor T3 and the input E1, and a second transistor T10 is between the two transistors T1 and T2 of the inverter.

FIG. 5 shows a switching circuit ComV to control the discharge transistor Tp1. The switching circuit ComV comprises a first P-channel transistor T5 and a second N-channel transistor T6 series-connected between the output voltage V$_{DD}$ and ground. Also included is a third P-channel transistor T7 and a second N-channel transistor T8 series-connected between the output voltage V$_{POL}$ and ground. A first connection point N1 between the first transistor T5 and the second transistor T6 is connected to the gate of the third transistor T7. A second connection point N2 between the third transistor T7 and the fourth transistor T8 is connected to the gate of the first transistor and to the gate of the discharge transistor Tp1. The second control signal SWP is applied to the gate of the transistor T6. The reverse /SWP of this signal is applied to the gate of the transistor T8. The working of a circuit of this kind is well known. As long as the signal SWP is at a logic 1, the node N2 remains at V$_{POL}$. This blocks the discharge transistor Tp1. When the signal SWP goes to a logic 0, the node N2 switches to zero. The transistor Tp1 comes on and the output voltage V$_{POL}$ falls.

FIG. 5 shows an improvement similar to that seen with reference to FIG. 4. Two additional P-channel transistors T11 and T12 are controlled at their gates by the supply voltage V$_{DD}$. The first transistor T11 is placed between the transistor T5 and the transistor T6. The second transistor T12 is placed between the transistor T7 and the transistor T8.

The voltage regulation circuit described in the present invention can also be applied for biasing the wells of P-channel transistors. Furthermore, in a circuit powered at a very low supply voltage V$_{DD}$, the gate of N-channel transistors may be controlled through an inverter powered by a voltage greater than the supply voltage V$_{DD}$. This increases the capability for these transistors to switch to a voltage below their gate voltage (V$_{DD}$ or 0 volts). The regulation of the voltage at two levels V1 and V2 does not hinder the application of the output voltage for this other use since these voltages (V1 and V2) are always greater than the supply voltage V$_{DD}$ of the circuit. The output voltage V$_{POL}$ may therefore be used in the integrated circuit for elements other than the wells of the P-channel transistors.

FIG. 7 is a schematic view of an integrated circuit CI comprising a device 10 having a positive charge pump voltage generator and a regulation circuit according to the invention. A control circuit 11 gives the first control signal Sleep to the regulation circuit. The output voltage V$_{POL}$ in this example is applied as a bias voltage for the P-channel transistor wells 12. The output voltage V$_{POL}$ can be applied in general to all P-channel transistors of the integrated circuit, or only to some of them. For example, the output voltage V$_{POL}$ can be applied to the P-channel transistors of the DRAM cells to improve the rate of data retention. In the example, this output voltage V$_{POL}$ is also applied as a supply voltage of an inverter stage 13 to control the gate of an N-channel transistor 14.

That which is claimed is:

1. A regulation circuit for regulating an output voltage of a positive charge pump connected to an integrated circuit, the regulation circuit comprising:

a comparison circuit having a first input receiving a reference voltage and a second input receiving the output voltage of the positive charge pump, and an output delivering an enabling signal to the positive charge pump;

a first switching circuit controlled by a first control signal for applying a first voltage level as the reference voltage when the integrated circuit is in an operational mode, and applying a second voltage level as the reference voltage when the integrated circuit is in a standby mode, the second voltage level being higher than the first voltage level;

a logic circuit for generating the first control signal;

a discharge transistor connected between an output of the positive charge pump and a supply voltage terminal; and a second switching circuit connected to the output of the positive charge pump and being controlled by the first control signal for causing said discharge transistor to support a transition in the output voltage from the second voltage level when the integrated circuit passes from the standby mode to the operational mode.

2. A regulation circuit according to claim 1, wherein the integrated circuit comprises a plurality of P-channel transistors formed in a plurality of wells; and wherein the output voltage of the positive charge pump is applied as a bias voltage to the plurality of wells, the output voltage being a first level output voltage greater by one MOS transistor threshold voltage level than a supply voltage level of the integrated circuit when in the operational mode, and a second level output voltage greater by two MOS transistor threshold voltage levels than the supply voltage level of the integrated circuit in the standby mode.

3. A regulation circuit according to claim 1, further comprising a diode connected between an output of the positive charge pump and a supply voltage terminal.

4. A regulation circuit according to claim 1, wherein the second switching circuit comprises:

a first P-channel transistor and a second N-channel transistor forming an inverter connected between the output voltage and ground, an input of the inverter being applied as a gate command to said discharge transistor; and a third P-channel holding transistor connected between the output voltage and the input of the inverter, said third P-channel holding transistor having a gate connected to an output of the inverter for receiving a gate command.

5. A regulation circuit according to claim 1, wherein said second switching circuit comprises:

a first P-channel transistor and a second N-channel transistor series-connected between the output voltage and ground; and a third P-channel transistor and a fourth N-channel transistor series-connected between the output voltage and ground, said third P-channel transistor having a gate connected to a first connection point between said first P-channel and said second N-channel transistor, said first P-channel transistor having a gate and said discharge transistor having a gate, both gates being connected to a second connection point between said third P-channel and said fourth N-channel transistor.

6. A regulation circuit according to claim 1, wherein said second switching circuit comprises a voltage limitation circuit controlled by a supply voltage.

7. A regulation circuit according to claim 1, further comprising a circuit for setting a level of a supply voltage as a level of the output voltage independent of a level of the first control signal.

8. A regulation circuit for regulating an output voltage of a charge pump connected to an integrated circuit, the regulation circuit comprising:

a comparison circuit having a first input receiving a reference voltage and a second input receiving the output voltage of the charge pump, and an output delivering an enabling signal to the charge pump;

a first switching circuit controlled by a first control signal for applying a first voltage level as the reference voltage when the integrated circuit is in an operational mode, and applying a second voltage level as the reference voltage when the integrated circuit is in a standby mode;

a discharge transistor connected between an output of the charge pump and a supply voltage terminal; and a second switching circuit connected to the output of the charge pump and being controlled by the first control signal for causing said discharge transistor to support a transition in the output voltage from the second voltage level when the integrated circuit passes from the standby mode to the operational mode.

9. A regulation circuit according to claim 8, wherein the second voltage level is higher than the first voltage level in said first switching circuit.

10. A regulation circuit according to claim 8, further comprising a logic circuit for generating the first control signal.

11. A regulation circuit according to claim 8, wherein the integrated circuit comprises a plurality of P-channel transistors formed in a plurality of wells; and wherein the output voltage of the charge pump is applied as a bias voltage to the plurality of wells, the output voltage being a first level output voltage greater by one MOS transistor threshold voltage level than a supply voltage level of the integrated circuit when in the operational mode, and a second level output voltage greater by two MOS transistor threshold voltage levels than the supply voltage level of the integrated circuit when in a standby mode.

12. A regulation circuit according to claim 8, further comprising a diode connected between an output of the charge pump and the supply voltage terminal.

13. A regulation circuit according to claim 8, wherein the second switching circuit comprises:

a first P-channel transistor and a second N-channel transistor forming an inverter connected between the output voltage and ground, an input of said inverter being applied as a gate command to said discharge transistor; and a third P-channel holding transistor connected between the output voltage and the input of the inverter, said third P-channel holding transistor having a gate connected to an output of the inverter for receiving a gate command.

14. A regulation circuit according to claim 8, wherein the second switching circuit comprises:

a first P-channel transistor and a second N-channel transistor series-connected between the output voltage and ground; and a third P-channel transistor and a fourth N-channel transistor series-connected between the output voltage and ground, said third P-channel transistor having a gate connected to a first connection point between said first P-channel and said second N-channel transistor, said first P-channel transistor having a gate and said discharge transistor having a gate, both gates being connected to a second connection point between said third P-channel and said fourth N-channel transistor.

15. A regulation circuit according to claim 8, wherein the second switching circuit comprises a voltage limitation circuit controlled by a supply voltage.

16. A regulation circuit according to claim 8, further comprising a circuit for setting a level of a supply voltage as a level of the output voltage independent of a level of the first control signal.

17. An integrated circuit comprising:

a charge pump for generating a pumped voltage; and a regulation circuit connected to said charge pump for regulating the pumped voltage, the regulation circuit comprising:

a comparison circuit having a first input receiving a reference voltage and a second input receiving the pumped voltage, and an output delivering an enabling signal to the charge pump, a first switching circuit controlled by a first control signal for applying a first voltage level as the reference voltage when the integrated circuit is in an operational mode, and applying a second voltage level as the reference voltage when the integrated circuit is in a standby mode, the second voltage level being higher than the first voltage level, a logic circuit for generating the first control signal, a discharge transistor connected between an output of the charge pump and a supply voltage terminal, and a second switching circuit connected to the output of the charge pump and being controlled by the first control signal for causing said discharge transistor to support a transition in the pumped voltage from the second voltage level when the integrated circuit passes from the standby mode to the operational mode.

18. An integrated circuit according to claim 17, further comprising a plurality of P-channel transistors formed in a plurality of wells; and wherein the pumped voltage of said charge pump is applied as a bias voltage to the plurality of wells, the pumped voltage being a first level output voltage greater by one MOS transistor threshold voltage level than a supply voltage level of the integrated circuit when in the operational mode, and a second level output voltage greater by two MOS transistor threshold voltage levels than the supply voltage level of the integrated circuit in the standby mode.

19. An integrated circuit according to claim 17, wherein said regulation circuit further comprises a diode connected between an output of said charge pump and a supply voltage terminal.

20. An integrated circuit according to claim 17, wherein said second switching circuit comprises:
   a first P-channel transistor and a second N-channel transistor forming an inverter connected between the output voltage and ground, an input of said inverter being applied as a gate command to said discharge transistor; and
   a third P-channel holding transistor connected between the output voltage and the input of the inverter, said third P-channel holding transistor having a gate connected to an output of the inverter for receiving a gate command.

21. An integrated circuit according to claim 17, wherein said second switching circuit comprises:
   a first P-channel transistor and a second N-channel transistor series-connected between the output voltage and ground; and
   a third P-channel transistor and a fourth N-channel transistor series-connected between the output voltage and ground, said third P-channel transistor having a gate connected to a first connection point between said first P-channel and said second N-channel transistor, said first P-channel transistor having a gate and said discharge transistor having a gate, both gates being connected to a second connection point between said third P-channel and said fourth N-channel transistor.

22. A method for regulating an output voltage of a charge pump connected to an integrated circuit, the method comprising the steps of:
   controlling a first switching circuit using a first control signal for providing a first voltage level as a reference voltage to a comparison circuit when the integrated circuit is in an operational mode, and providing a second voltage level as the reference voltage to the comparison circuit when the integrated circuit is in a standby mode;
   comparing the reference voltage to the output voltage of the charge pump in the comparison circuit for providing an enabling signal therefrom to the charge pump;
   controlling the first control signal using a logic circuit; and
   controlling a second switching circuit connected to the output of the charge pump using the first control signal for causing a discharge transistor connected between the output of the charge pump and a supply voltage terminal to support a transition in the output voltage from the second voltage level when the integrated circuit passes from the standby mode to the operational mode.

23. A method according to claim 22, wherein the integrated circuit comprises a plurality of P-channel transistors formed in a plurality of wells; and the method further comprising the step of:
   biasing the plurality of wells with the output voltage of the charge pump, the output voltage being a first level output voltage greater by one MOS transistor threshold voltage level than a supply voltage level of the integrated circuit when in the operational mode, and a second level output voltage greater by two MOS transistor threshold voltage levels than the supply voltage level when the integrated circuit is in the standby mode.

24. A method according to claim 22, wherein the second switching circuit comprises:
   a first P-channel transistor and a second first Nchannel transistor forming an inverter connected between the output voltage and ground, an input of the inverter being applied as a gate command to the discharge transistor; and
   a second P-channel holding transistor connected between the output voltage and the input of the inverter, and an output of the inverter being applied as a gate command to the second P-channel holding transistor.

25. A method according to claim 22, wherein the second switching circuit comprises a first P-channel transistor and a first N-channel transistor series-connected between the output voltage and ground; and
   a second P-channel transistor and a second N-channel transistor series-connected between the output voltage and ground, a first connection point between the first P-channel and N-channel transistor is connected to a gate of the second P-channel transistor, a second connection point between the second P-channel and N-channel transistor is connected to a gate of the first P-channel transistor and to a gate of the discharge transistor.

26. A method according to claim 22, further comprising the step of controlling a supply voltage using the second switching circuit.

27. A method according to claim 22, further comprising the step of setting a level of a supply voltage as a level of the output voltage independent of a level of the first control signal.

* * * * *